United States Patent
Kim et al.

(10) Patent No.: US 12,183,842 B2
(45) Date of Patent: Dec. 31, 2024

(54) SOLAR CELL MODULE AND METHODS FOR FABRICATING THE SAME

(71) Applicant: SHANGRAO XINYUAN YUEDONG TECHNOLOGY DEVELOPMENT CO. LTD, Jiangxi Province (CN)

(72) Inventors: Jinsung Kim, Seoul (KR); Chunghyun Lim, Seoul (KR)

(73) Assignee: SHANGRAO XINYUAN YUEDONG TECHNOLOGY DEVELOPMENT CO. LTD, Jiangxi Province (CN)

( * ) Notice: Subject to any disclaimer, the term of this patent is extended or adjusted under 35 U.S.C. 154(b) by 0 days.

(21) Appl. No.: 16/668,828

(22) Filed: Oct. 30, 2019

(65) Prior Publication Data
US 2020/0135953 A1   Apr. 30, 2020

(30) Foreign Application Priority Data
Oct. 31, 2018  (KR) ......................... 10-2018-0132012

(51) Int. Cl.
*H01L 31/05*   (2014.01)
*H01L 31/0224*   (2006.01)
*H01L 31/0236*   (2006.01)

(52) U.S. Cl.
CPC .. *H01L 31/0516* (2013.01); *H01L 31/022433* (2013.01); *H01L 31/02363* (2013.01); *H01L 31/0508* (2013.01); *H01L 31/0512* (2013.01)

(58) Field of Classification Search
CPC ....... H01L 31/022433; H01L 31/02363; H01L 31/05; H01L 31/0504; H01L 31/0508; H01L 31/0512
See application file for complete search history.

(56) References Cited

U.S. PATENT DOCUMENTS 4,877,481 A * 10/1989 Fukuda ............... G02F 1/13439
                                                                136/258
5,667,596 A *  9/1997 Tsuzuki ................ H01L 31/048
                                                                136/244
(Continued)

FOREIGN PATENT DOCUMENTS

CN    102376809 A    3/2012
CN    103681894 A    3/2014
(Continued)

OTHER PUBLICATIONS

Kawasaki, JP-2015198142-A, Machine translation (Year: 2015).*
(Continued)

*Primary Examiner* — Devina Pillay
(74) *Attorney, Agent, or Firm* — Tarolli, Sundheim, Covell & Tummino LLP

(57) ABSTRACT

Discussed is a solar cell module including a plurality of solar cells including a first electrode and a second electrode, the plurality of solar cells being disposed along a first direction and a plurality of wiring members connected to the first electrode of a first solar cell and the second electrode of a second solar cell, wherein each of the plurality of solar cells includes a first side surface of one side in the first direction, a second side surface having a larger surface roughness than the first side surface on another side, and a protrusion formed adjacent to the second side surface, and wherein the first and second solar cells are disposed with a gap of approximately 0.5 mm to 1.5 mm, and the first side surface of the second solar cell and the second side surface of the first solar cell are disposed to face each other.

17 Claims, 10 Drawing Sheets

(56) References Cited

U.S. PATENT DOCUMENTS

| | | | | |
|---|---|---|---|---|
| 2009/0242032 A1* | 10/2009 | Yamazaki | ........... | H01L 31/0725 |
| | | | | 257/E21.599 |
| 2013/0306128 A1 | 11/2013 | Kannou et al. | | |
| 2015/0381109 A1* | 12/2015 | Choi | ................... | H01L 31/0201 |
| | | | | 136/251 |
| 2016/0322527 A1* | 11/2016 | Hwang | ............... | H01L 31/0201 |
| 2017/0243992 A1* | 8/2017 | Rostan | ................ | H01L 31/0201 |
| 2019/0259885 A1* | 8/2019 | Yoshikawa | ............ | H01L 31/18 |
| 2020/0127153 A1* | 4/2020 | Sachs | .................. | H01L 31/0508 |

FOREIGN PATENT DOCUMENTS

| | | |
|---|---|---|
| CN | 105226124 A | 1/2016 |
| CN | 108713257 A | 10/2018 |
| DE | 20215106374 U1 | 1/2016 |
| EP | 1548847 A2 | 6/2005 |
| GB | 2530583 A | 3/2016 |
| JP | 6-21501 A | 1/1994 |
| JP | 08139349 A | 5/1996 |
| JP | 2015198142 A * | 11/2015 |
| JP | 2016072637 A | 5/2016 |
| JP | 2016-134448 A | 7/2016 |
| JP | 2016-225824 A | 12/2016 |
| JP | 2016225624 A | 12/2016 |
| JP | 2017-528926 A | 9/2017 |
| JP | 2018-93167 A | 6/2018 |
| KR | 20180050262 A | 5/2018 |
| WO | WO 2012/043770 A1 | 4/2012 |
| WO | WO-2013021296 A1 * | 2/2013 ............... C09G 1/04 |
| WO | WO 2015/183827 A2 | 12/2015 |
| WO | WO-2018084159 A1 * | 5/2018 ......... H01L 31/0216 |

OTHER PUBLICATIONS

Chinese Office Action for Corresponding Application Serial No. 201911050079.8, Dated Oct. 25, 2022, pp. 1-11.

KR Office Action—Request for the Submission of an Opinion for Application No. 10-2018-0132012, dated Oct. 31, 2018, invention entitled Solar Cell Module, pp. 1-13.

* cited by examiner

SOLAR CELL MODULE AND METHODS FOR FABRICATING THE SAME

CROSS-REFERENCE TO RELATED APPLICATION

This application claims priority to and the benefit of Korean Patent Application No. 10-2018-0132012 filed in the Korean Intellectual Property Office on Oct. 31, 2018, the entire contents of which are incorporated herein by reference.

BACKGROUND OF THE INVENTION

Field of the Invention

Embodiments of the invention relates to a solar cell module in which a plurality of solar cells are connected by a wiring member and a method for fabricating the same.

Description of the Related Art

A plurality of solar cells are connected in series or in parallel by ribbons, and are fabricated in a form of solar cell panels by a packaging process for protecting the plurality of solar cells.

Various methods can be used to connect the solar cells, for example, it is possible to connect the solar cells using a ribbon having a large width of about 1.5 mm. However, since losses of light can occur due to the large width of the ribbon, the number of ribbons disposed in the solar cell should be reduced. Then, moving distances of carriers increase, so that the electrical characteristics may not be excellent or adequate.

Therefore, a structure of increasing the number of wiring members and reducing the moving distances of the carriers by using the wiring members having a width smaller than the ribbon instead of the ribbon has been proposed.

By the way, since the wiring member is made of metal, it is not easily bent or warped, when two neighboring solar cells are connected with a plurality of wiring members, a gap between the two neighboring solar cells can be widened. Thus, there is a problem that the overall appearance size of the solar cell module increases.

On the other hand, a new type of solar cell module that divides a solar cell (hereinafter, a mother solar cell) produced in standard sizes to improve output into a plurality and compose a solar cell module has been proposed.

By the way, in a case of composing the solar cell module using such a divided solar cell, since the number of the solar cells used when composing one string is increased by multiples of the previous (when using the mother solar cell) than when the solar cell module is composed using the mother solar cell, there is a problem that the overall size of the solar panel is increased.

As the size of the solar cell panel increases, because it is difficult for producers of the solar cells to use the existing equipment, that is, the existing production equipment installed to fit the solar cell panels made of the mother solar cells and thus new production equipment must be installed, there is a problem that the price competitiveness of the product is lowered due to the excessive production cost of the product.

Therefore, even when fabricating the solar cell panel by connecting the divided solar cells with the plurality of wiring members, there is a need for a technology that can be used as is without changing the existing equipment.

On the other hand, the process of dividing the solar cell into a plurality of solar cells irradiates a laser along an imaginary cutting line on a surface of the solar cell to form a division groove, and divides the solar cell mechanically along this division groove. As a result, the mother solar cell can be divided into a plurality of solar cells.

By the way, in the process of irradiating the laser on the surface of the solar cell, the surface is recrystallized, during this recrystallization, burrs are generated around the division groove. As a result, the periphery of the division groove is formed to protrude outward.

Therefore, when connecting two neighboring divided solar cells using the wiring members, the process of connecting under the interference of the burrs is not easy, in addition, when the wiring members are in contact with the burrs, there is a problem that the output of the solar cell module falls while a shunt path is made.

SUMMARY OF THE INVENTION

The present invention has been made in view of the above technical background, when connecting divided solar cells with a plurality of wiring members, it is to prevent the size of the solar panel from increasing by reducing a gap between the two neighboring solar cells than before.

In addition, another object of the present invention is to prevent the wiring member and the burr from being in contact with each other when connecting two neighboring divided solar cells.

A solar cell module according to an embodiment of the present invention includes a plurality of solar cells each having a long axis and a short axis, including a first electrode disposed on a front surface and a second electrode disposed on a back surface thereof, and the plurality of solar cells being disposed along a first direction and a plurality of wiring members connected to the first electrode of a first solar cell and the second electrode of a second solar cell adjacent to the first solar cell among the plurality of solar cells, wherein each of the plurality of solar cells includes a first side surface of one side in the first direction, a second side surface having a larger surface roughness than the first side surface on another side, and a protrusion formed to be adjacent to the second side surface on the back surface, and wherein the first solar cell and the second solar cell are disposed with a gap of approximately 0.5 mm to 1.5 mm, and the first side surface of the second solar cell and the second side surface of the first solar cell are disposed to face each other.

The plurality of solar cells each can include a semiconductor substrate, a first conductive type region formed on a front surface of the semiconductor substrate, and having a first conductive type opposite to a conductivity of the semiconductor substrate, and a second conductive type region having a second conductive type as the semiconductor substrate, and formed on a back surface of the semiconductor substrate.

The protrusion can be formed on the second conductive type region.

End parts of the plurality of wiring members can be disposed to be adjacent to the protrusion on the back surface of the second solar cell in the first direction.

The second electrode can include a plurality of finger lines parallel to each other and a plurality of pad parts electrically connected to the finger lines and positioned along the first direction, and the end parts of the plurality of wiring members can be joined to an outermost pad disposed to be closest to the protrusion of the second solar cell among the plurality of pad parts in the first direction.

Thicknesses of the plurality of wiring members can be approximately 270 μm to 320 μm, and the plurality of wiring members can include a core layer of metal, and a solder layer formed on surrounding a surface of the core layer and including a solder material, and a thickness of the core layer can be approximately 240 μm to 280 μm.

The wiring member can have a wire shape, and that a number of the plurality of wiring members is about 8 to 12, for example.

The short axis can be approximately half the size or length of the long axis.

A method for fabricating solar cell module according to another embodiment of the present invention includes dividing a mother solar cell into a plurality of solar cells by irradiating a laser to form a groove on one surface of the mother solar cell and separating the mother solar cell along the groove, wherein the plurality of solar cells each has a long axis and a short axis, and includes a first electrode disposed on a front surface and a second electrode disposed on a back surface thereof, disposing the plurality of solar cells along a first direction, and connecting a plurality of wiring members to the first electrode of a first solar cell and the second electrode of a second solar cell adjacent to the first solar cell among the plurality of solar cells, wherein each of the plurality of solar cells includes a first side surface of one side in the first direction, a second side surface having a larger surface roughness than the first side surface on the other side, and a protrusion formed to be adjacent to the second side surface on the back surface, and wherein the first solar cell and the second solar cell are disposed with a gap of approximately 0.5 mm to 1.5 mm, and the first side surface of the second solar cell and the second side surface of the first solar cell are disposed to face each other.

According to an embodiment of the present invention, when forming the solar cell module with the divided solar cells by reducing the gap between two neighboring solar cells than before, it is to prevent the string from becoming longer. In addition, the gap between the two neighboring solar cells can be reduced, thereby causing a shunt path. However, it is to prevent the problem of contact between the protrusion and the wiring member by disposing the cut surface and the non-cut surface to face each other.

DETAILED DESCRIPTION OF THE EMBODIMENTS

Figure 1:
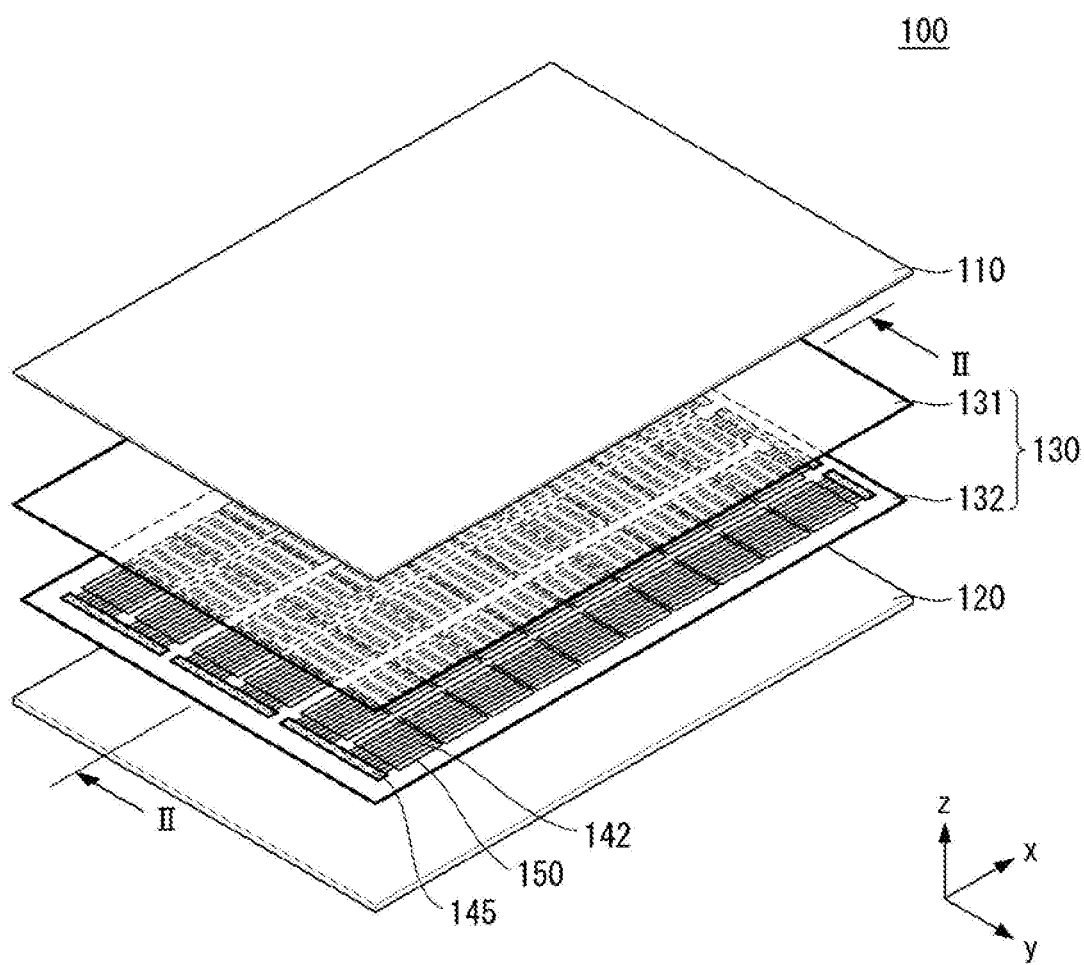
FIG. 1 is a perspective view illustrating a solar cell panel according to an embodiment of the present invention.

Hereinafter, embodiments of the present invention will be described in detail with reference to the accompanying drawings. However, it is needless to say that the present invention is not limited to these embodiments and can be modified into various forms.

In the drawings, illustration of the parts not related to the description is omitted in order to clarify and briefly describe the present invention, and the same reference numerals are used for the same or very similar parts throughout the specification. In the drawings, the thickness, width, and the like are enlarged or reduced to make the explanation more clear, and the thickness, width, etc. of the present invention are not limited to those shown in the drawings.

When a part is referred to as "including" another part throughout the specification, it does not exclude other parts and can further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell and a solar cell panel including the solar cell according to an embodiment of the present invention will be described in detail with reference to the accompanying drawings. In the following, the expressions "first", "second", "third", etc. are used only to distinguish each other, but the present invention is not limited thereto.

Figure 2:
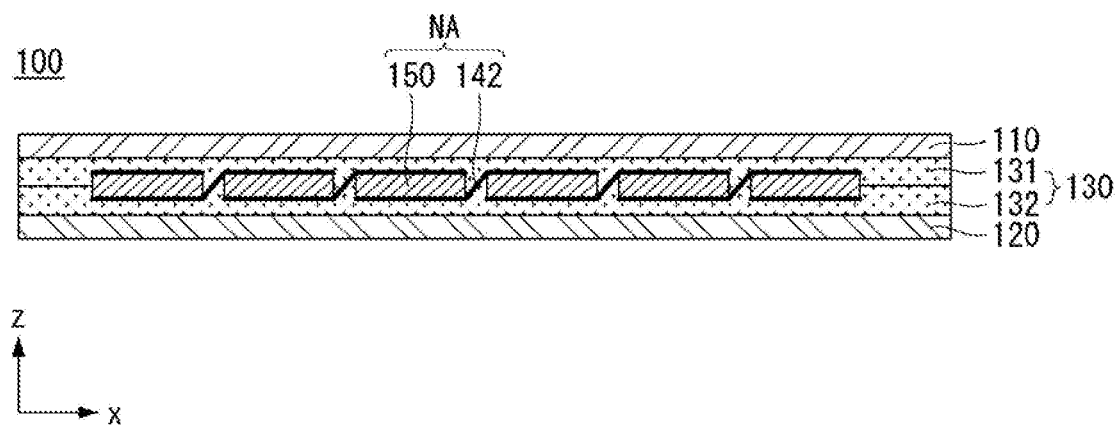
FIG. 2 is a cross-sectional view taken along a line II-II in FIG. 1.

FIG. 1 is a perspective view illustrating a solar cell panel according to an embodiment of the present invention, and FIG. 2 is a cross-sectional view taken along a line II-II in FIG. 1.

Referring to FIGS. 1 and 2, a solar cell panel 100 according to the present embodiment includes a plurality of solar cells 150 and a wiring member (or a wire, an interconnector, etc.) 142 for electrically connecting the plurality of solar cells 150. The solar cell panel 100 includes a sealing member 130 that surrounds and seals a solar cell module (MA) including the plurality of solar cells 150 and the wiring member (or interconnector) 142 connecting them, a first cover member 110 positioned on a front surface of the solar cell 150 on the sealing member 130, and a second cover member 120 positioned on a back surface of the solar cell 150 on the sealing member 130. This will be explained in more detail.

First, the solar cell 150 can include a photoelectric conversion unit that converts the solar cell into electric energy, and an electrode that is electrically connected to the photoelectric conversion unit to collects and transfers a current. The plurality of solar cells 150 can be electrically connected in series, parallel, or series-parallel by the wiring member 142. Specifically, the wiring member 142 electrically connects two neighboring solar cells 150 among the plurality of solar cells 150.

A bus ribbon 145 alternately connects both ends of the wiring member 142 of a bundle of solar cells connected by the wiring member 142, that is, the solar cell module (one row is individually called a string). The bus ribbon 145 can be disposed at an end part of the string in a direction intersecting the end. This bus ribbon 145 can connect the strings adjacent to each other, or can connect the string or the strings to a junction box that prevents reverse flow of the current. The material, shape, connection structure, etc. of the bus ribbon 145 can be variously modified, and the present invention is not limited thereto.

The sealing member 130 can include a first sealing member 131 positioned on the front surface of the solar cell 150 connected by the wiring member 142, and a second sealing member 132 positioned on the back surface of the solar cell 150. The first sealing member 131 and the second sealing member 132 prevent moisture and oxygen from entering and chemically bind each element of the solar cell panel 100. The first and second sealing members 131 and 132 can be made of an insulating material having transparency and adhesiveness. For example, an ethylene-vinyl acetate copolymer resin (EVA), a polyvinyl butyral, a silicon resin, an ester-based resin, an olefin-based resin, or the like can be used for the first sealing member 131 and the second sealing member 132. The second cover member 120, the second sealing member 132, the solar cell 150, the first sealing member 131, and the first cover member 110 are integrated to form the solar cell panel 100 by a lamination process or the like using the first and second sealing members 131 and 132.

The first cover member 110 is positioned on the first sealing member 131 to constitute the front surface of the solar cell panel 100, and the second cover member 120 is positioned on the second sealing member 132 to constitute the back surface of the solar cell panel 100. The first cover member 110 and the second cover member 120 can be made of an insulating material capable of protecting the solar cell 150 from external shock, moisture, ultraviolet rays, or the like. The first cover member 110 can be made of a light penetrating material capable of penetrating light, and the second cover member 120 can be made of a sheet composed of or including a light penetrating material, a non-light penetrating material, or a reflective material. For example, the first cover member 110 can be composed of or including a glass substrate or the like, and the second cover member 120 can have a TPT (Tedlar/PET/Tedlar) type, or include a polyvinylidene fluoride (PVDF) resin layer formed on at least one surface of a base film (for example, polyethylene terephthalate (PET)).

However, the present invention is not limited thereto. Accordingly, the first and second sealing members 131 and 132, the first cover member 110, or the second cover member 120 can include various materials other than those described above, and can have various shapes. For example, the first cover member 110 or the second cover member 120 can have various shapes (for example, a substrate, a film, a sheet, etc.) or materials.

Figure 3:
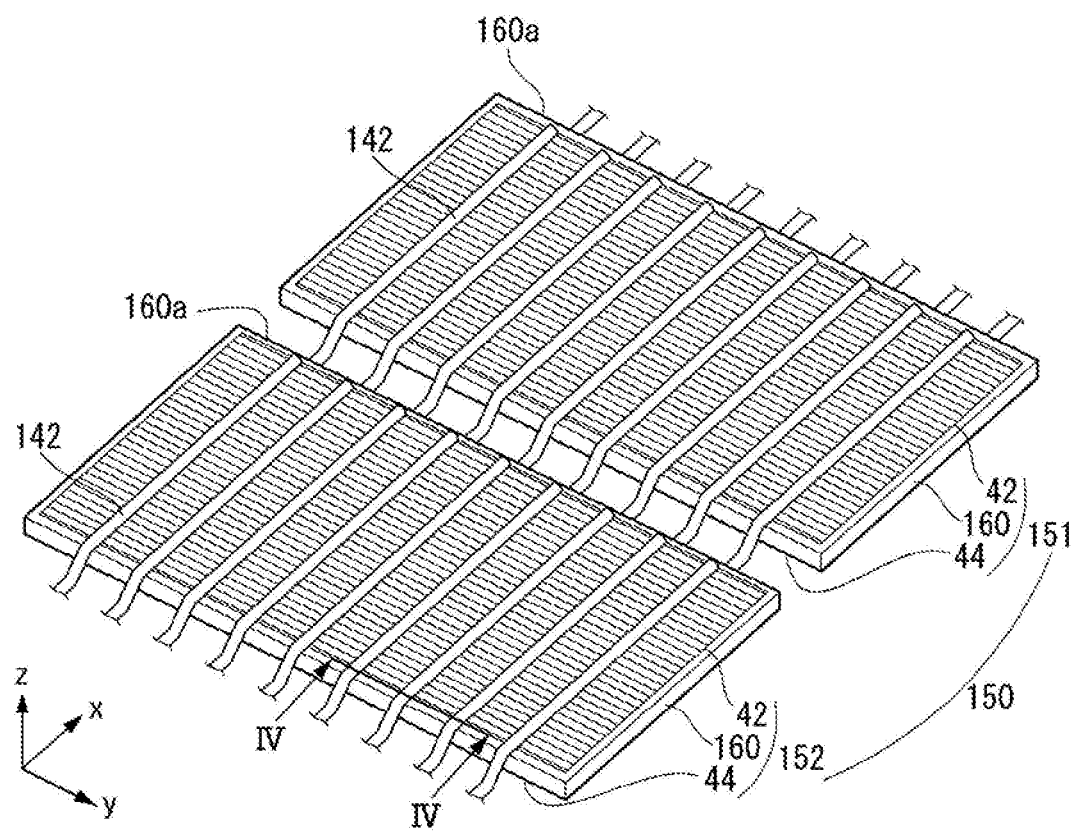
FIG. 3 is a perspective view illustrating a solar cell module according to an embodiment of the present invention.
Figure 4:
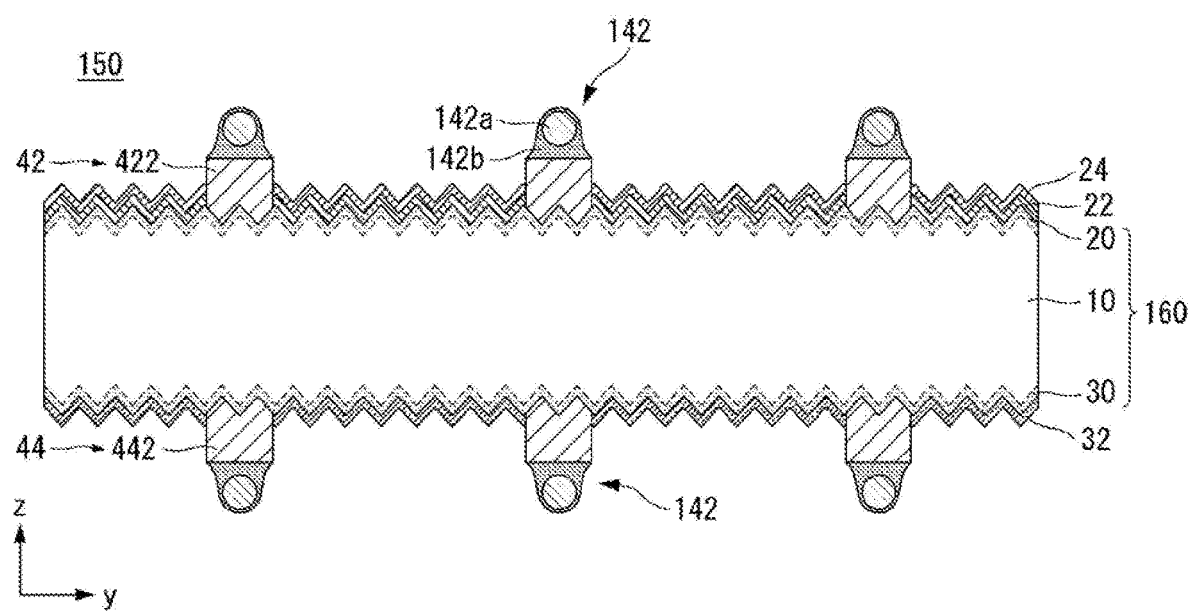
FIG. 4 is a cross-sectional view taken along a line IV-IV in FIG. 3.

Hereinafter, with reference to FIGS. 3 and 4, the configuration of a solar cell module and a solar cell according to an embodiment of the present invention will be described in more detail. FIG. 3 is a perspective view illustrating an example of a solar cell module constituting the solar panel 100 shown in FIG. 1, and FIG. 4 is a cross-sectional view taken along a line IV-IV in FIG. 3. For simplicity, electrodes 42 and 44 are schematically illustrated in FIG. 4.

Referring to FIGS. 3 and 4, the solar cell 150 includes a semiconductor substrate 160, conductive type regions 20 and 30 formed at or on the semiconductor substrate 160, and electrodes 42 and 44 connected to the conductive type regions 20 and 30. The conductive type regions 20 and 30 can include a first conductive type region 20 having a first conductive type and a second conductive type region 30 having a second conductive type. The electrodes 42 and 44 can include a first electrode 42 connected to the first conductive type region 20 and a second electrode 44 connected to the second conductive type region 30. Furthermore, the solar cell 150 can further include first and second passivation layers 22 and 32, an anti-reflection layer 24, and the like.

The semiconductor substrate 160 can be composed of includes a crystalline semiconductor (for example, a single crystal or polycrystalline semiconductor, for example, a single crystal or polycrystalline silicon) including a single semiconductor material (for example, a group 4 element). Then, since the semiconductor substrate 160 having a high degree of crystallinity and having few defects is used as a base, the solar cell 150 can have excellent electrical characteristics.

The front surface and/or the back surface of the semiconductor substrate 160 can be textured to have unevenness. The unevenness can have, for example, a pyramid shape having an irregular size, whose outer surface is composed of the plane (111) of the semiconductor substrate 160. As a result, the reflectance of light can be reduced if having a relatively large surface roughness. However, the present invention is not limited thereto.

In this embodiment, the semiconductor substrate 160 includes a base region 10 having the first or second conductive type by doping a first or second conductive type dopant with a lower doping concentration than the first or second conductive type region 20, 30. As an example, the base region 10 can have the second conductive type in this embodiment.

As an example, the first conductive type region 20 can compose or provide an emitter region that forms a p-n junction with the base region 10. The second conductive type region 30 can form a back surface field to form a back field region for preventing recombination. Here, the first and second conductive type regions 20 and 30 can be formed as a whole on the front surface and the back surface of the semiconductor substrate 160. Thus, the first and second conductive type regions 20 and 30 can be formed with a sufficient area without additional patterning. However, the present invention is not limited thereto.

In this embodiment, the base region 10 and the conductive type regions 20 and 30 composing the semiconductor substrate 160 are exemplified as regions having a crystal structure of the semiconductor substrate 160 and different conductive type, doping concentration, etc. That is, it is illustrated that the conductive type regions 20 and 30 are doped regions constituting a part of the semiconductor substrate 160. However, the present invention is not limited thereto. Therefore, at least one of the first conductive type region 20 and the second conductive type region 30 can be formed of an amorphous, microcrystalline or polycrystalline semiconductor layer or the like, which is formed on the semiconductor substrate 160 as a separate layer. Other variations are possible.

The first conductive type dopant included in the first conductive type region 20 can be an n-type or p-type dopant, and the second conductive type dopant included in the base region 10 and the second conductive type region 30 can be a p-type or n-type dopant. Group 3 elements such as boron (B), aluminum (Al), gallium (Ga), or indium (In) can be used as the p-type dopant, and group 5 elements such as phosphorus (P), arsenic (As), bismuth (Bi), and antimony (Sb) can be used as the n-type dopant. The second conductive type dopant in the base region 10 and the second conductive type dopant in the second conductive type region 30 can be the same material or different materials.

For example, the first conductive type region 20 can have a p-type, the base region 10 and the second conductive type region 30 can have an n-type. Then, holes having a slower moving speed than electrons can move to the front surface of the semiconductor substrate 160, rather than the back surface thereof, thereby improving the conversion efficiency. However, the present invention is not limited thereto, and the opposite case is also possible.

An insulating layer such as the first and second passivation layers 22 and 32 for immobilizing defects of the conductive type regions 20 and 30, and the anti-reflection layer 24 for preventing reflection of light can be formed on the surface of the semiconductor substrate 160. Such an insulating layer can be composed of or include an undoped insulating layer which does not contain a dopant separately. The first and second passivation layers 22 and 32 and the anti-reflection layer 24 can be formed substantially entirely on the front surface and back surface of the semiconductor substrate 160 except for parts (more precisely, parts where a first or second opening is formed) corresponding to the first or second electrode 42, 44.

For example, the first or second passivation layer 22, 32 or the anti-reflection layer 24 can have a silicon nitride layer, a silicon nitride layer containing hydrogen, a silicon oxide layer, a silicon oxynitride layer, an aluminum oxide layer, any one single layer selected from a group consisting of $MgF_2$, ZnS, $TiO_2$ and $CeO_2$ or a multi-layered structure in which two or more layers are combined. For example, the first or second passivation layer 22 or 32 can include a silicon oxide layer, a silicon nitride layer, or the like having a fixed positive charge when the first or second conductive type region 20 or 30 has an n-type, and can include an aluminum oxide layer, or the like having a fixed negative charge when the first or second conductive type region 20 or 30 has a p-type. As one example, the anti-reflection layer 24 can include silicon nitride. In addition, the material of the insulating layer, the multi-layered structure, and the like can be variously modified.

The first electrode 42 is electrically connected to the first conductive type region 20 through a first opening and the second electrode 44 is electrically connected to the second conductive type region 30 through a second opening. The first and second electrodes 42 and 44 are made of various materials (for example, metal materials) and can be formed to have various shapes. The shape of the first and second electrodes 42 and 44 will be described later.

As described above, in this embodiment, since the first and second electrodes 42 and 44 of the solar cell 150 have a certain pattern, the solar cell 150 has a bi-facial structure in which light can be incident on the front surface and the back surface of the semiconductor substrate 160. Accordingly, the amount of light used in the solar cell 150 can be increased to contribute to the efficiency improvement of the solar cell 150.

However, the present invention is not limited thereto, and it is also possible that the second electrode 44 is formed entirely on the back surface of the semiconductor substrate 160. It is also possible that the first and second conductive type regions 20 and 30 and the first and second electrodes 42 and 44 are positioned together on one surface (for example, the back surface) of the semiconductor substrate 160, and it is also possible that at least one of the first and second conductive type regions 20 and 30 is formed over both surface of the semiconductor substrate 160. That is, the solar cell 150 described above is merely an example, and the present invention is not limited thereto.

The solar cell 150 described above is electrically connected to the neighboring solar cell 150 by the wiring member 142 positioned (e.g., in contact with) on the first electrode 42 or the second electrode 44.

The solar cell 150 having such a configuration is fabricated by dividing a mother solar cell into two pieces or by half, and when first and second solar cells 151 and 152 are combined, it can be a single mother solar cell. Such a mother solar cell will be described in detail later with reference to FIG. 6.

In an embodiment of the present invention, the solar cell module includes the plurality of solar cells and the plurality of wiring members for electrically connecting neighboring two solar cells. In FIG. 3, only two solar cells, namely first and second solar cells 151 and 152 are selectively shown for simplicity of illustration. In addition, in FIG. 3, the first and second solar cells 151 and 152 are schematically illustrated mainly on the semiconductor substrate 160 and the electrodes 42 and 44.

Figure 5:
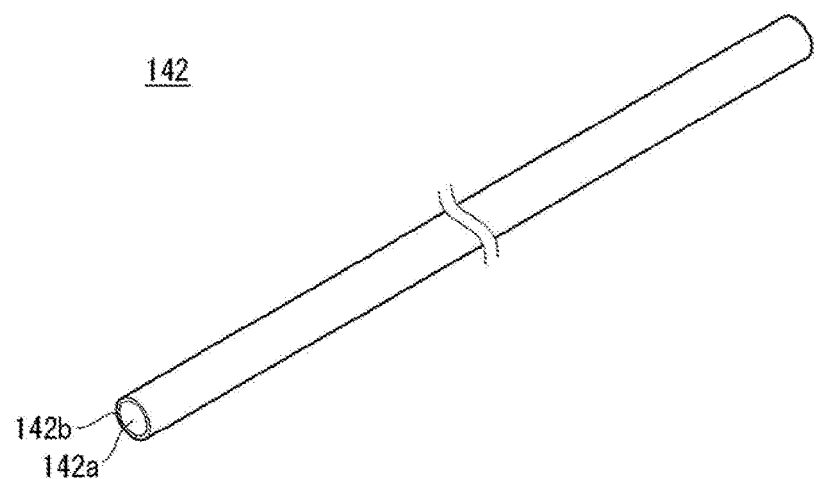
FIG. 5 is a perspective view showing an overall appearance of a wiring member.

Regarding the wiring member, it will be described in detail with reference to FIGS. 4 and 5. FIG. 5 is a perspective view showing an overall appearance of a wiring member.

Referring to FIGS. 4 and 5, the wiring member 142 connects the second electrode 44 positioned on a back surface of the first solar cell 151 and the first electrode 42 positioned on a front surface of the second solar cell 152 disposed to be adjacent to the right side of the first solar cell 151. Another wiring member 142 connects the first electrode 42 positioned on a front surface of the first solar cell 151 and the second electrode 44 positioned on a back surface of another solar cell disposed to be adjacent to the left side of the first solar cell 151. Other wiring member 142 connects the second electrode 44 positioned on a back surface of the second solar cell 152 and the first electrode 42 positioned on a front surface of other solar cell disposed to be adjacent to the right side of the second solar cell 152. Accordingly, the plurality of solar cells 150 can be connected to each other by the wiring member 142 to form one row. Hereinafter, the description of the wiring member 142 can be applied to all the wiring member 142 connecting two neighboring solar cells 150.

As such, the wiring member electrically connects the first electrode 42 disposed on the front surface of the neighboring first solar cell 151 and the second electrode 44 disposed on the back surface of the second solar cell 152. Thus, the wiring member 142 is bent in a form of a diagonal line between the first solar cell 151 and the second solar cell 152 to connect two neighboring solar cells.

However, at this time, if the number of wiring members for connecting the two neighboring solar cells is too large, or the thickness of the wiring members becomes thick, it is difficult to bend them, so that a gap between the first and second solar cells is inevitably increased. As a result, the overall size of the solar panel increases.

Furthermore, when the solar cell module is configured with the divided solar cells as in the present invention, since the number of solar cells forming a string increases in multiples than that of the mother solar cell, the size of the solar panel is bound to be larger.

In view of this, it is by example that the wiring member 142 is configured to have a thin diameter wire shape so as to bend well. Since the wiring member 142 has a wire shape unlike a ribbon having a relatively wide width (for example, 1 mm to 2 mm), which is used in the past, and also, the thickness is very thin than that of the ribbon, the amount of light incident on the solar cell can be increased more effectively. In addition, since it bends more easily than the conventional ribbon, in one embodiment, it is possible to prevent the overall size of the solar cell panel from growing by effectively reducing the gap between the solar cells formed of the divided solar cells.

As an example, the maximum width of the wiring member 142 is 250 μm to 500 μm, more for example, 270 μm to 320 μm. In addition, the maximum width of the wiring member can be adjusted by using the number of wiring members as a variable, for example, when the number of wiring members becomes large, the diameter of the wiring member becomes smaller as the number increases in order to effectively maintain the space between the first and second solar cells, and when the number of wiring member becomes small, the diameter of the wiring member can be larger. This is described in detail below.

Here, the maximum width of the wiring member 142 can mean a largest width among widths passing the center of the wiring member 142. When the wiring member 142 has the maximum width described above, it is possible to effectively maintain the space between the first and second solar cells 150 while keeping the resistance of the wiring member 142 low and minimizing optical loss.

The number of the wiring members 142 can be greater than the number (for example, 2 to 5) of the conventional ribbons on the basis of one surface of each solar cell 150. Then, a movement distance of carriers can be reduced by a large number of the wiring members 142 while minimizing the optical loss and material cost by the wiring member 142 having a small width. Thus, the efficiency of the solar cell 150 and the output of the solar cell panel 100 can be improved by reducing the movement distance of the carriers while reducing the optical loss, and productivity of the solar cell panel 100 can be improved by reducing the material cost due to the wiring member 142.

In order to prevent the process of attaching the wiring member 142 to the solar cell 150 from becoming complicated when the number of the wiring member 142 having the small width is used in a large number, in this embodiment, the wiring member 142 can have a structure including a core layer 142a and a solder layer 142b formed on the surface of the core layer 142a. Then, a large number of the wiring member 142 can be effectively attached by the process of applying heat and pressure while the wiring member 142 is placed on the solar cell 150.

The wiring member 142 or the core layer 142a, which is included in the wiring member 142 and occupies most of the wiring member 142, can include rounded parts. That is, at least a part of the cross section of the wiring member 142 or the core layer 142a can include a circle, a part of a circle, an ellipse, a part of an ellipse, or a part made of a curve.

If it has such a shape, the wiring member 142 is formed in a structure in which the solder layer 142b is entirely positioned on the surface of the core layer 142a, the process of separately applying the solder material and the like are omitted, so that the wiring member 142 can be attached by positioning the wiring member 142 directly on the solar cell 150.

Thus, the process of attaching the wiring member 142 can be simplified. In addition, light reflected by the wiring member 142 can be re-incident on the solar cell 150 and reused by being reflected or diffused by the rounded parts of the wiring member 142. Accordingly, since the amount of light incident on the solar cell 150 is increased, the efficiency of the solar cell 150 and the output of the solar cell panel 100 can be improved.

In addition, as the wiring member has a wire shape, the wiring member can be stretched or bent well, thereby effectively reducing the gap between the first and second solar cells, and as a result, even when the solar cell panel is composed of the divided solar cells, the total size of the solar cell panel is not increased, and thus the solar cell panel can be produced even with the divided solar cells using the existing equipment, that is, the fabricating equipment installed to fabricate the solar cells using the mother solar cell.

The number of the wiring members 142 can be 10 to 15 based on one surface of the solar cell 150, and for example, can be 8 to 12, and they can be spaced apart from each other at a uniform distance.

In this embodiment, the wiring member 142 can include the core layer 142a made of metals and the solder layer 142b that is formed on the surface of the core layer 142a and includes solder material to enable soldering with the electrodes 42, 44. That is, the solder layer 142b can serve as a kind of an adhesive layer. For example, the core layer 142a can include Ni, Cu, Ag, Al, or the like as a main material (for example, a material containing 50 wt % or more, more specifically, a material containing 90 wt % or more). The solder layer 142b can include a solder material such as Pb, Sn, SnIn, SnBi, SnPb, SnPbAg, SnCuAg, SnCu, or the like as a main material. However, the present invention is not limited thereto, and the core layer 142a and the solder layer 142b can include various materials.

It is by example that the total thickness of the wiring member 142 configured as described above is 270 μm to 320 μm or approximately thereabout, and the thickness of the core layer 142a is 240 μm to 280 μm or approximately thereabout. Here, the thickness of the core layer 142a refers to a thickness measured based on the longest cross section.

If the thickness of the core layer 142a is smaller than 240 μm, the line resistance becomes too large and the output efficiency decreases excessively, and if it is thicker than 280 μm, it is impossible to bend the wiring member 142 into a desired shape due to the core layer made of metal, and thus it is impossible to reduce the size between the first and second solar cells to a desired size.

On the other hand, when the wiring member 142 is attached to the solar cell 150 by a tabbing process, as shown in FIG. 4, a shape of the solder layer 142b is changed in a part of the wiring member 142 attached to or connected to the solar cell 150.

More specifically, the wiring member 142 is attached to the electrodes 42 and 44 (the pad when the pad is provided) by the solder layer 142b. At this time, the solder layer 142b of each wiring member 142 is individually positioned with other wiring member 142 or solder layer 142b. When the wiring member 142 is attached to the solar cell 150 by the tabbing process, each solder layer 142b flows down to the first or second electrodes 42, 44 (more specifically, the pad parts 422 and 424) as a whole during the tabbing process, and a width of the solder layer 142b can gradually increase toward the pad parts 422, 442 at a part adjacent to each pad part 422, 442 or a part positioned between the pad parts 422, 442 and the core layer 142a. As one example, the part adjacent to the pad parts 422 and 442 in the solder layer 142b can have a width equal to or greater than a diameter of the core layer 142a. At this time, the width of the solder layer 142b can be equal to or less than a width of the pad parts 422, 442.

More specifically, the solder layer 142b has a shape protruding toward the outside of the solar cell 150 along the shape of the core layer 142a in an upper part of the core layer 142a. On the other hand, the solder layer 142b includes a part having a concave shape with respect to the outside of the solar cell 150 in a lower part of the core layer 142a or a part adjacent to the pad parts 422 and 442. As a result, an inflection point where the curvature changes is positioned on the side surface of the solder layer 142b. It can be seen that the wiring member 142 are individually attached and fixed by the solder layer 142b without being inserted or covered in a separate layer, film, or the like from this shape of the solder layer 142b. The solar cell 150 and the wiring member 142 can be connected by a simple structure and a process by fixing the wiring member 142 by the solder layer 142b without using a separate layer or a film. Particularly, the wiring member 142 having a narrow width and a rounded shape as in the present embodiment can be attached without using a separate layer, a film, (for example, a conductive adhesive film including a resin and a conductive material) or the like, so that the process cost and time of the wiring member 142 can be minimized.

On the other hand, the part of the wiring member 142 positioned between the neighboring solar cells 150 (that is, outside the solar cell 150), which is not applied with heat or is applied with relatively less heat even after the tabbing process, can have a shape in which the solder layer 142b has a uniform thickness as shown in FIG. 4.

According to the present embodiment, optical loss can be minimized by diffused reflection or the like using a wire-shaped wiring material 142, and it is possible to reduce the movement path of the carrier by increasing the number of the wiring member 142 and reducing a pitch of the wiring member 142. In addition, the width or diameter of the wiring member 142 can be reduced, so that the material cost can be greatly reduced. Accordingly, the efficiency of the solar cell 150 and the output of the solar cell panel 100 can be improved.

Figure 6:
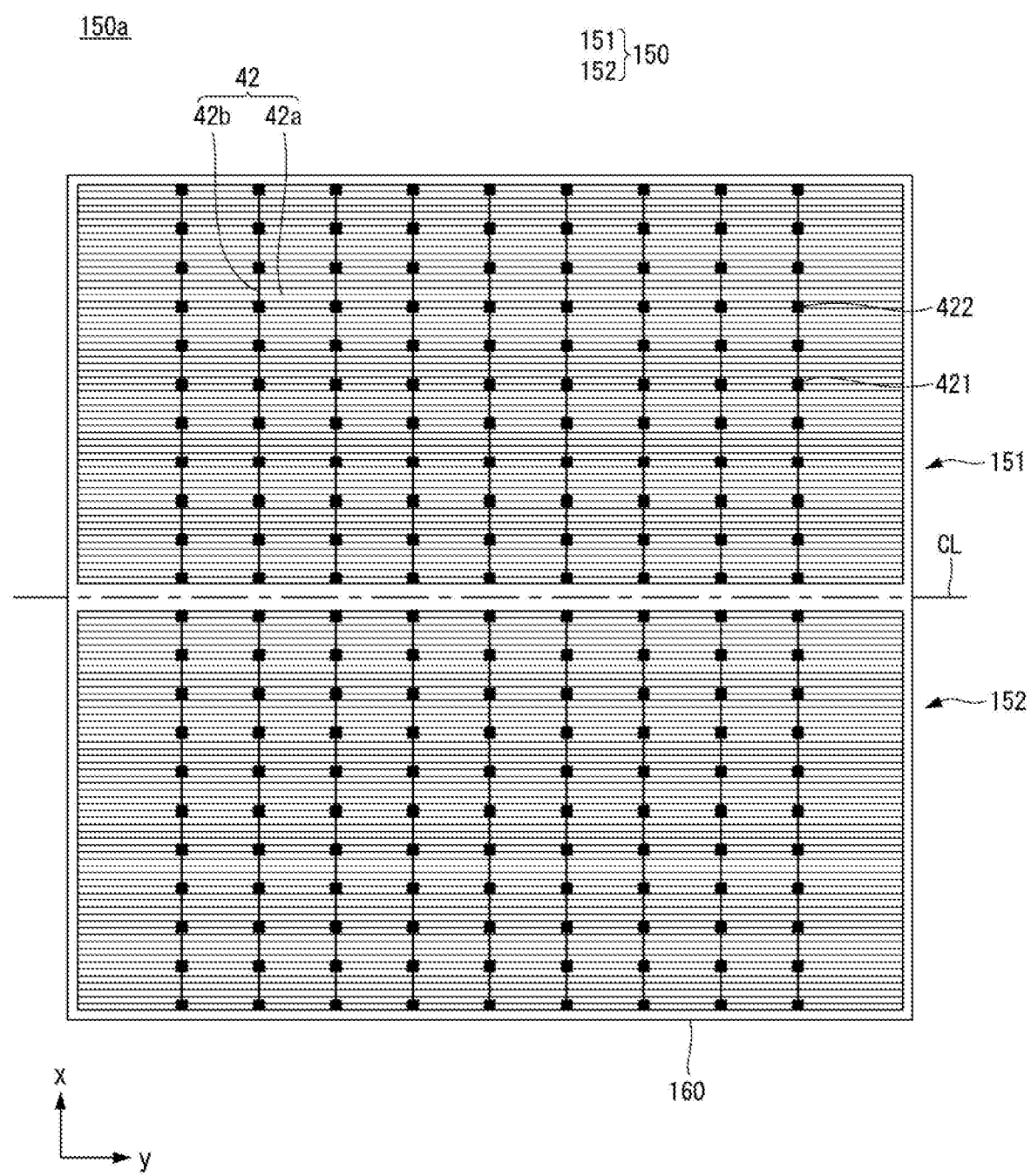
FIG. 6 is a plan view schematically showing a front surface of a mother solar cell forming a half cut cell shown in FIG. 4.

The solar cell module of an embodiment having such a configuration is made through the solar cell made by dividing the mother solar cell into a plurality. FIG. 6 is a plan view illustrating a front surface of an example mother solar cell. Hereinafter, referring to FIGS. 3 and 6, an embodiment of a solar cell module formed with a solar cell will be described.

In the present embodiment, one mother solar cell 150a is cut along a cutting line CL to fabricate first and second solar cells 151 and 152 which are a plurality of solar cells. Each of the first and second solar cells 151 and 152, which are unit solar cells, functions as one solar cell 150. When the mother solar cell 150a is divided into two solar cells 150 as described above, cell to module loss (CTM loss), which occurs when the plurality of solar cells 150 are connected to form the solar panel 100, can be reduced. That is, if the area of the solar cell is reduced to reduce the current generated by the solar cell itself, the CTM loss of the solar panel 100 can be reduced by reducing the current reflected by the squared value even if the number of the solar cells 150 reflected as is increased.

In this embodiment, after the mother solar cell 150a is fabricated by the existing fabricating method, the mother solar cell 150a is cut to reduce the area of the solar cell 150, after the mother solar cell 150a is fabricated, this can be cut by using the existing equipment and the optimized design as is according to this. This minimizes the burden on equipment and process costs. On the other hand, if it is fabricated by reducing the size itself of the mother solar cell 150a, there is a burden such as replacing the used equipment or changing the setting.

In general, the semiconductor substrate 160 of the mother solar cell 150a is made from an ingot, and lengths of sides in two axes (for example, an axis parallel to a finger line 42a and an axis parallel to a bus bar 42b) orthogonal to each other, such as circular, square or similar shapes, are the same or similar to each other. For example, in the present embodiment, the semiconductor substrate 160 of the mother solar cell 150a can have a square shape. Accordingly, the mother solar cell 150a has a symmetrical shape, and a maximum horizontal axis and a maximum vertical axis, and a minimum horizontal axis and a minimum vertical axis have the same distance.

In this embodiment, since the mother solar cell 150a is cut along the cutting line CL to form the solar cell 150, the solar cell 150 has a shape having a long axis and a short axis.

In the present embodiment, the cutting line CL can be parallel to a first direction (y-axis direction in the drawing), which is a longitudinal direction of the finger lines 42a and 44a, and continue to cross a second direction (x-axis direction in the drawing), which is an extending direction of the bus bars 42b and 44b.

Accordingly, in the first electrode 42 positioned on the front surface of the semiconductor substrate 160 in each solar cell 150, a plurality of first finger lines 42a extend in the first direction parallel to the long axis and are positioned in parallel with each other, and a first bus bar 42b is formed in the second direction parallel to the short axis. The first bus bar 42b can include a plurality of first pad parts 422 spaced apart from each other in the second direction parallel to the short axis.

Similarly, in the second electrode 44, a plurality of second finger lines extend in the first direction parallel to the long axis and are positioned in parallel with each other, and a second bus bar is formed in the second direction parallel to the short axis. The second bus bar can include a plurality of second pad parts. Descriptions of the shape, position, and the like of the first finger line 42a and the first bus bar 42b can be applied to the second finger line and the second bus bar as is.

Accordingly, the long axis of the solar cell 150 is positioned in parallel with the first direction, the short axis of the solar cell 150 is positioned in parallel with the second direction, and the wiring member 142 connects the neighboring first and second solar cells 151 and 152 in the short axis direction (see FIG. 3).

In FIG. 3, after cutting one mother solar cell 150 into two, an inclined part 160a is disposed to be positioned in the same direction, so that it is illustrated that the cut surfaces along the cutting line CL are not in contact with each other. As a result, when the cut surfaces formed by the cutting lines CL are not disposed to face each other, the risk of electrical shorting and the like can be reduced as compared to face each other. In addition, as described below, it is possible to prevent a shunt path formed by the wiring member that is in contact with the protrusion formed by the burr generated during the cutting of the mother solar cell along the cut surfaces at the back surface of the solar cells 151 and 152.

In the above-described drawings and descriptions, it was illustrated that one mother solar cell 150*a* was cut along one cutting line CL to form two solar cells 150. However, the present invention is not limited thereto, and it is also possible to form three or more solar cells 150 by cutting one mother solar cell 150*a* along two or more cutting lines CL.

In addition, in the above-described drawing and description, the first electrode 42 and/or the second electrode 44 are not formed near the cutting line CL, so that it is illustrated that the first electrode 42 and/or the second electrode 44 corresponding to each solar cell 150 are spaced apart from each other with the cutting line CL interposed therebetween. However, the present invention is not limited thereto, and the first electrode 42 and/or the second electrode 44 corresponding to the plurality of solar cells 150 can be formed to be connected to each other and separated from each other by the cutting line CL in the mother solar cell 150*a*. For example, after the mother solar cell 150*a* having the bus bar and the pad part is formed, the solar cell 150 can be formed by cutting the mother solar cell 150*a* along the cutting line CL parallel to the first direction.

The structures of the first and second electrodes 42 and 44 described above can be applied to the plurality of solar cells 150, respectively, or can be applied to any one or some of the plurality of solar cells 150.

Figure 7:
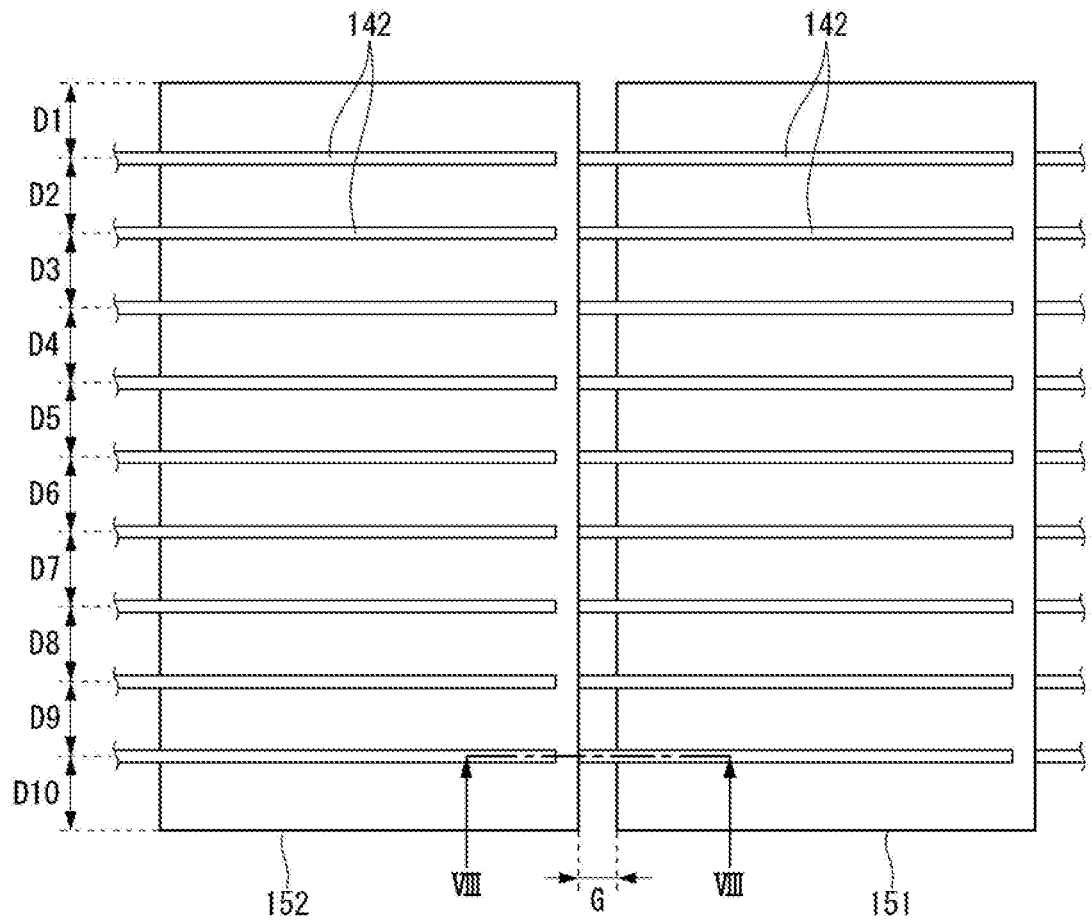
FIG. 7 is a plan view illustrating a schematic view of a solar cell module shown in FIG. 3.
Figure 8:
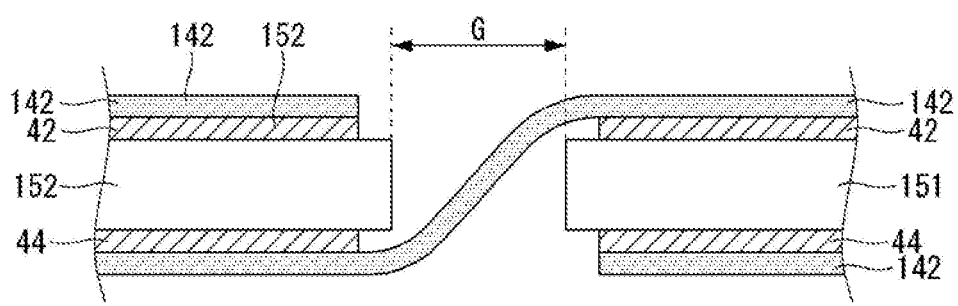
FIG. 8 is a cross-sectional view taken along a line VIII-VIII in FIG. 7.

FIG. 7 is a plan view illustrating a schematic view of a solar cell module shown in FIG. 3. FIG. 8 is a cross-sectional view taken along a line VIII-VIII in FIG. 7. In FIG. 7 and FIG. 8, only components necessary for convenience of description are shown in a simplified form.

In the solar cell module according to an embodiment, the first and second solar cells 151 and 152 are disposed to face each other with neighboring side surfaces, and also spaced apart from each other to have a first gap G. In FIG. 7, only neighboring first and second solar cells 151 and 152 are illustrated, but two neighboring solar cells in one entire string can be disposed to have such a first gap G.

The plurality of wiring members 142 are disposed to connect the neighboring first and second solar cells 151 and 152 and can be separated from each other by distances D1-D10, each of which can be a constant interval or a varying interval, one side of the wiring member is joined to the first electrode 42 disposed on the front surface of the first solar cell 151, and the other side is joined to the second electrode 44 disposed on the back surface of the second solar cell 152. Therefore, the wiring member 142 is bent between the first and second solar cells 151 and 152. More precisely, between the first and second solar cells 151 and 152, the wiring member 142 is bent downward along the side surface of the first solar cell 151, and when it is close to the side surface of the second solar cell 152, on the contrary, the wiring member 142 faces upward with respect to the side surface, or is bent in parallel with at least the second electrode 44 of the second solar cell 152. Thus, the wiring member 142 has an inflection point at which the bending direction is changed at points adjacent to the side surface of the first solar cell 151 and the side surface of the second solar cell 152, respectively.

Therefore, the amount of bending of the wiring member 142 is determined according to this inflection point, and the first gap G, which is a degree of spreading of the first and second solar cells, is determined according to the bending of the wiring member 142. The first gap G can be a variable based on the thickness of the wiring member 142, in addition, a material constituting the wiring member 142, in particular, a material for forming the core layer 142*a* can be an important variable, however, in the embodiment, since the thickness of the wiring member 142 is 250 μm to 500 μm, and by example 270 μm to 320 μm, the influence of the forming material can be regarded as a variable which does not act greatly.

Figure 9:
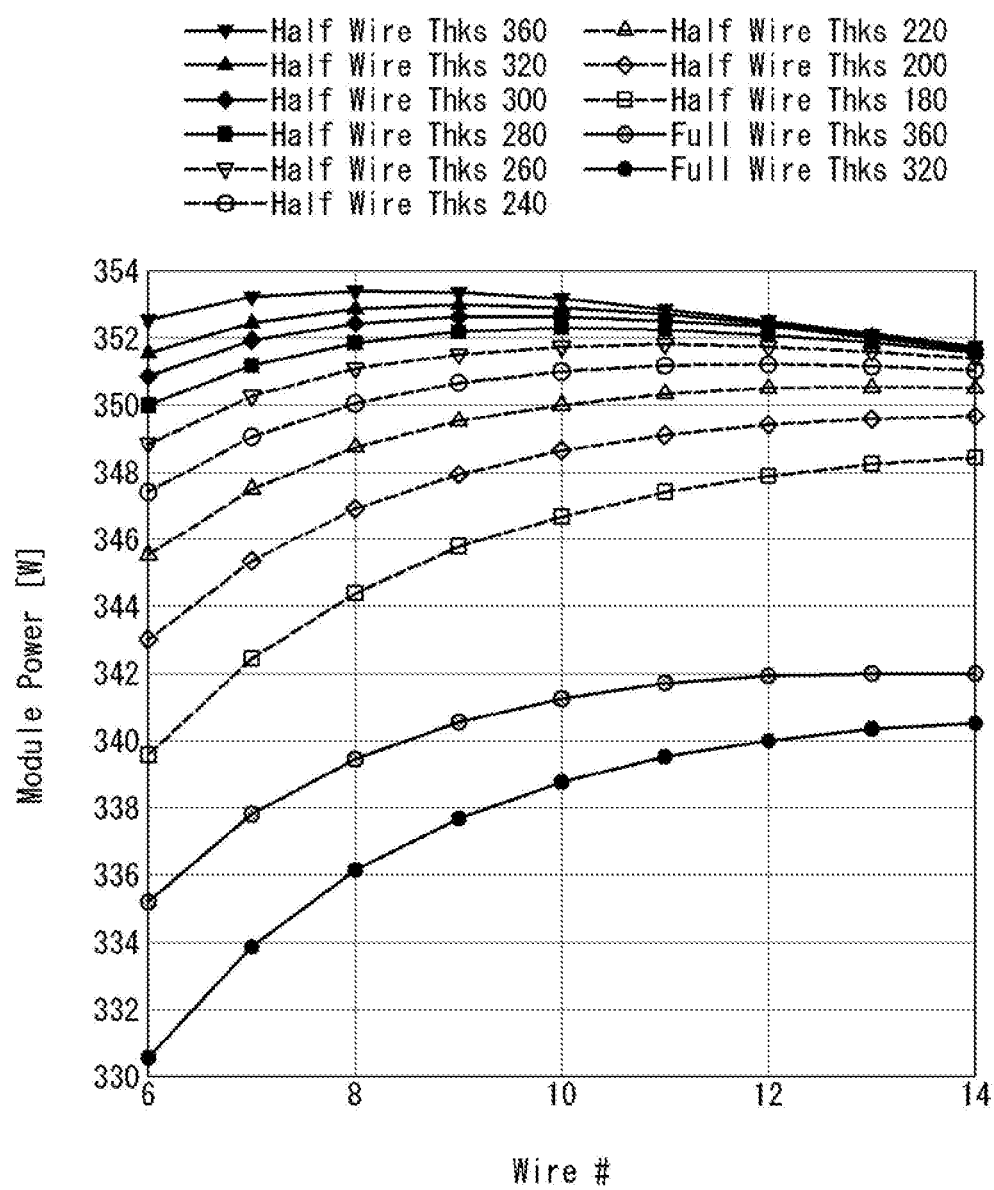
FIGS. 9 and 10 are graphs showing simulation results of outputs depending on the number of wiring members measured by diameters, numbers of wiring members and gaps of solar cells as variables.
Figure 10:
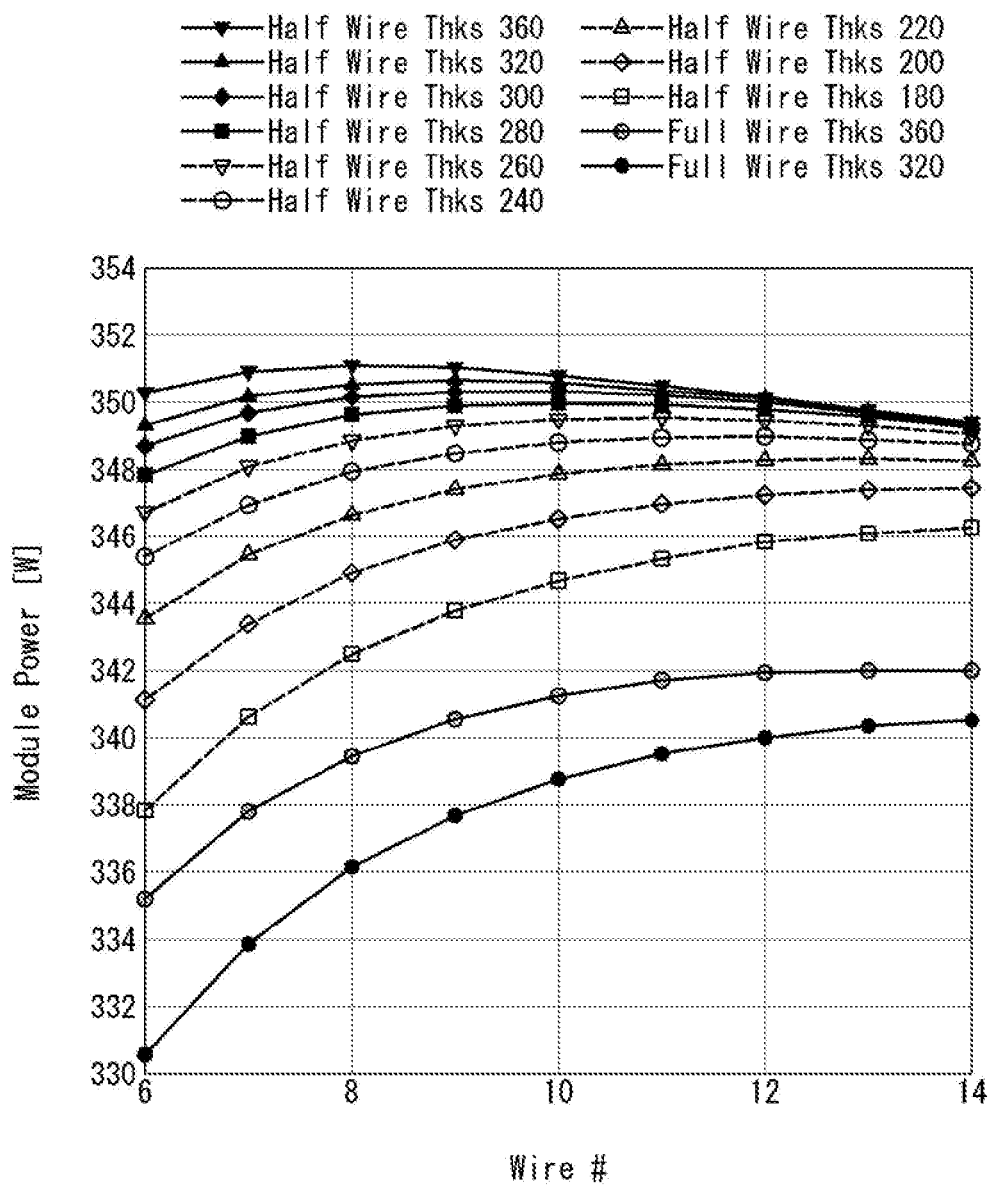

On the other hand, FIGS. 9 and 10 are graphs showing output and efficiency of a module depending on a thickness of a wiring member. In FIG. 9 and FIG. 10, experimental examples (half wire thks 360~half wire thks 180) compose a solar cell module using unit solar cells formed by dividing a mother solar cell into two, and comparative examples (full wire thks 320~half wire thks 240) compose a solar cell module using a mother solar cell. Here, in the solar cell module of the experimental examples, the unit solar cells are composed of being connected in series of 6*20, and in the solar cell module of the comparative examples, the mother solar cells are composed of being connected in series of 6*10. In FIG. 9, the solar cells of the experimental examples and the mother solar cells of the comparative examples are disposed 2.5 mm apart from neighboring strings in each string, in FIG. 10, being disposed 1.0 mm apart, so that it can be seen not only the output comparison between the comparative example and the experimental example, but also how the output varies depending on the disposition gap G of the solar cell. In FIG. 9 and FIG. 10, the thickness of the wiring member refers to the thickness of the core layer. In embodiments of the invention, thks refers to thickness.

First, in FIG. 9, it can be seen that the module output of the experiment examples (half wire thks 360~half wire thks 180) is greater than that of the comparative examples (full wire thks 320~half wire thks 240). Here, the module output (P) is a value obtained by Equation 1 below, and can refer to a value obtained by multiplying a voltage (V) and a current (I) produced by the solar cell module.

$$P = VI \text{ (W)} \qquad \text{[Equation 1]}$$

As can be seen through FIGS. 9 and 10, it can be seen that the experimental examples have a larger module output than the comparative examples regardless of the thickness of the wiring member, and it can be seen that the thicker the wiring member, the more the module output increases in both the experimental examples and the comparative examples.

In comparison, in the case of the comparative examples, the module output increases as the number of wiring members increases, but it can be seen that at some point, that is, the number of wiring members converges to a constant value from 12, and this phenomenon can be similarly confirmed in the experimental examples. When the number of wiring members is larger than 12, it can be seen that the module output is not greatly improved in consideration of the error range. In addition, since the output is reduced by about twice at a point where the number of wiring members is 8 or less (between 6 and 8) than at a point where the number of wiring members is 8 or more (between 8 and 10) based on a point where the number of wiring members is 8, it can be seen that this point (the number of wiring members is 8) is an inflection point.

Considering these, in the present invention it is by example that the number of wiring members is at least 8 or more and at most 12 or less.

Hereinafter, look at the module output change of the experimental examples. The experimental examples of FIG.

9 show the module output when the disposition gap of the unit solar cells is 2.5 mm, and the experimental examples of FIG. 10 show the module output when the disposition gap of the unit solar cells is 1.0 mm. Comparing FIG. 9 and FIG. 10, it can be seen that the module output of the experimental examples of FIG. 10 is reduced by about 2.4 (W) as a whole than the module output of the experimental examples of FIG. 9. This reduction in power can refer to a reduction in power of less than about 1%, based on module output 350 (W).

On the other hand, it can be seen that the experimental examples of FIG. 10 is higher than the experimental examples of FIG. 9 in the module efficiency. Here, the module output (P) refers to absolute output produced by the module, and the module efficiency (Q) refers to relative output produced per unit area (S). The module efficiency is defined as in Equation 2 below.

$$Q = P/S \text{ (W/mm}^2\text{)} \quad \text{[Equation 2]}$$

When a module is composed with a disposition gap of 2.5 mm in the unit solar cell, an area of the module is 1,740 mm*1,016 mm=1,767,840 (mm$^2$), and when a module is composed with a disposition gap of 1.0 mm in the unit solar cell, an area of the module is 1,686*1,016 mm=1,712,976 mm$^2$.

Therefore, it can be seen that the module efficiency of the experimental examples of FIG. 10 is about 2 to 3% higher than the module efficiency of the experimental examples of FIG. 9. As described above, when comparing the experimental example and the comparative example, it can be seen that the module output decreases when the solar cell disposition gap is reduced, but the module efficiency increases by more than the decrease of the module output.

As described above, the solar cell being included in the solar cell module of one embodiment is formed by cutting the mother solar cell 150a along the cutting line CL. Here, the cutting line CL is an imaginary line for dividing the mother solar cell, and the mother solar cell 150a can be cut into plural pieces by laser processing.

Figure 11:
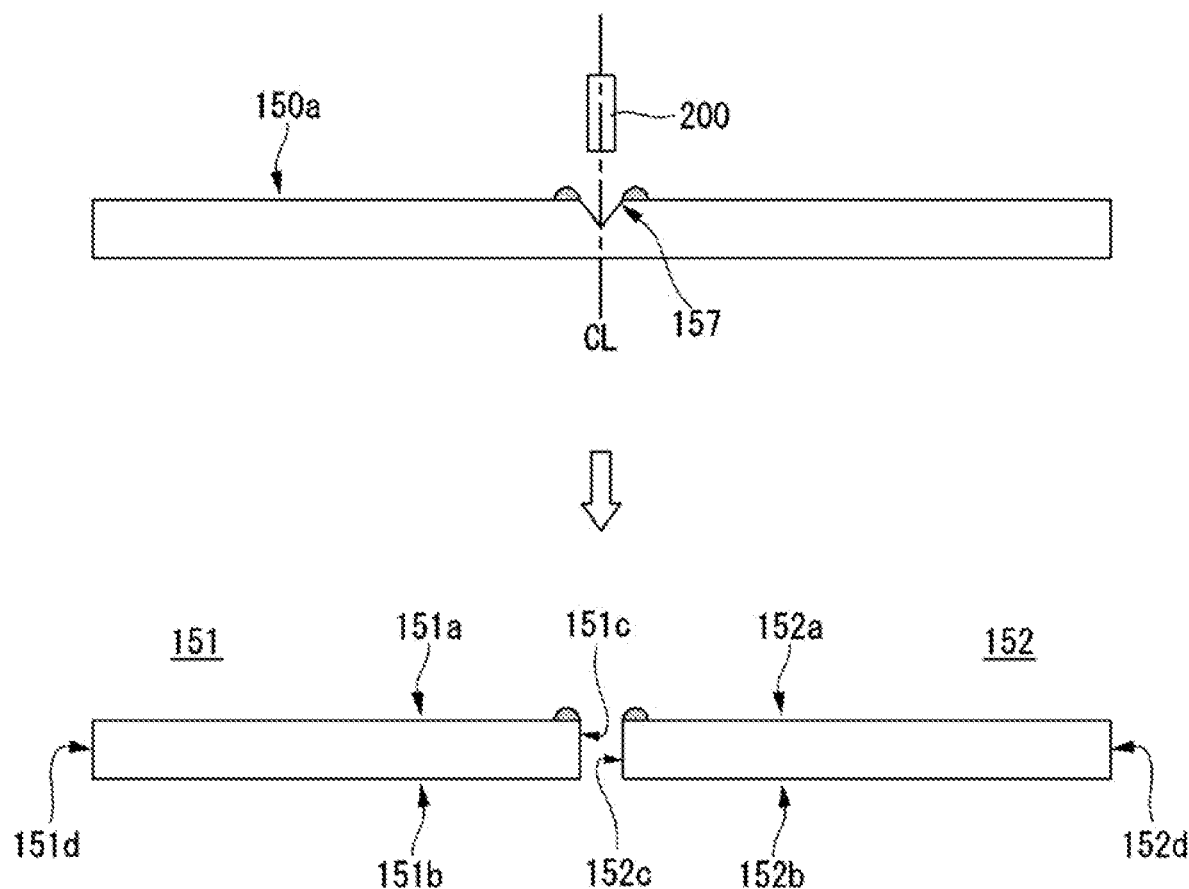
FIG. 11 is a diagram schematically showing a state in which a mother solar cell is divided into first and second solar cells along a cutting line by laser processing.

FIG. 11 is a diagram schematically showing a state in which a mother solar cell is divided into first and second solar cells along a cutting line by laser processing. Referring to this drawing, the mother solar cell 150a is disposed to face a laser device 200 in the front surface or the back surface, and the laser device 200 forms a division groove 159 along the cutting line CL by irradiating a laser on the front surface or the back surface of the mother solar cell 150a. The mother solar cell in which the division grooves 159 are formed can be divided into the first and second solar cells 151 and 152 under mechanical shock or stress such as by cleaving. Other ways of dividing the first and second solar cells 151 and 152 can be used, such as cutting, slicing or melting at the center line CL or others.

On the other hand, the back surface of the mother solar cell 150a is disposed to face the laser device 200 and a laser 232 is irradiated toward the second conductive type region 30, so that the division groove 159 can be formed at a side of the second conductive type region 30. This is because the second conductive type region 30 can have a relatively low level of required characteristics as compared to an emitter region which directly contributes to photoelectric conversion as a back field region. That is, since the laser is not irradiated to the first conductive type region 20 requiring a high level of characteristics, the first conductive type region 20 can be effectively protected.

In addition, the division groove 159 can be formed in the second conductive type region 30 or a part of the second conductive type region 30 and the semiconductor substrate 10 so that the laser is not directly irradiated to the first conductive type region 20 in the process of the laser irradiation.

The laser irradiated from the laser device 200 to the surface of the mother solar cell 150a removes the surface and a part of the interior thereof to form the division groove 159, in this process, the part irradiated by the laser is re-melted, the burr is joined to the division groove 159 of the mother solar cell 150a to be formed to the back of the solar cell, even after the mother solar cell 150a is divided into the first and second solar cells 151 and 152, the burr remains as is to form a protrusion 157. In embodiments of the present invention, the protrusion 157 can be raised portions having one or more peaks above planar surfaces 151a, 151b of the first solar cell 151 or above planar surfaces 152a, 152b of the second solar cell 152. The one or more peaks of the protrusion 157 can be a single peak having about the same height along a length of the protrusion 157 or a connected peak having series of maximums and minimums along the length of the protrusion 157 that are connected. Alternatively, the one or more peaks of the protrusion 157 can be plural peaks that are disconnected from each other and having about the same height along the length of the protrusion 157 or a series of disconnected peaks having maximums and minimums along the length of the protrusion 157 that are connected, or a combination of connected and disconnected peaks of varying lengths and variance in the maximums and minimums to be essentially random.

However, when connecting the first and second solar cells 151, 152 with the wiring members, due to the protrusion 157, the protrusion 157 and the wiring member 142 are undesirably in contact with each other to form a shunt path, so that the efficiency of the solar cell module can be reduced. In particular, this shunt problem occurs remarkably when the gap between the first and second solar cells 151 and 152 are disposed to be 0.5 mm to 1.5 mm or approximately thereabout as described above.

This will be described in detail with reference to FIGS. 12 and 13.

Figure 12:
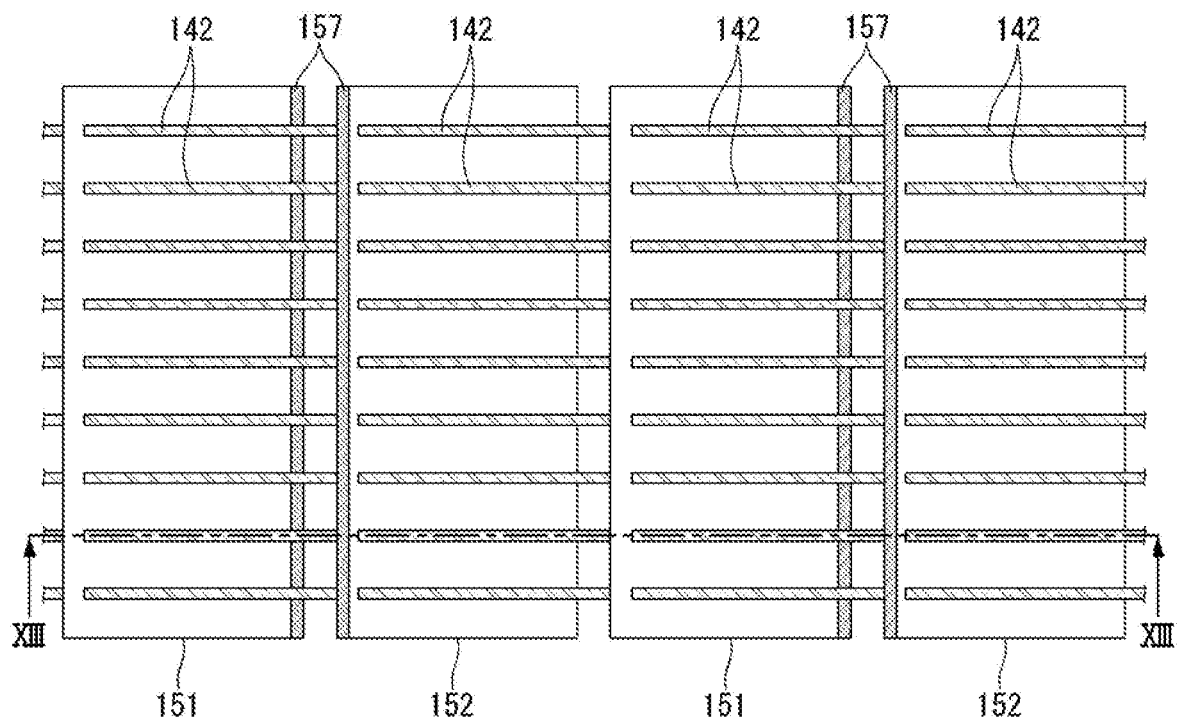
FIG. 12 is a plan view of a solar cell module disposed so that cut surfaces of first and second solar cells face each other.
Figure 13:
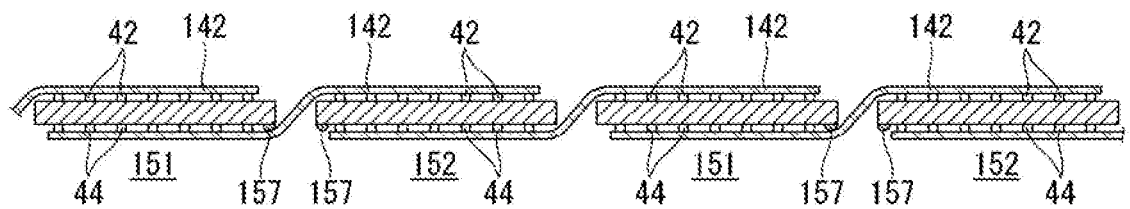
FIG. 13 is a cross-sectional view taken along a line XIII-XIII in FIG. 12

FIG. 12 is a plan view of a solar cell module disposed so that cut surfaces of first and second solar cells face each other, and FIG. 13 is a cross-sectional view taken along a line XIII-XIII in FIG. 12. FIGS. 12 and 13 illustrate to selectively extract and simplify necessary formation for convenience of description. In addition, in FIG. 12, the back surfaces of the first and second solar cells are illustrated.

Referring to these drawings, in an example, the first and second solar cells 151 and 152 can be repeatedly disposed in a pair of the first solar cell 151 and the second solar cell 152 so as to have the same shape as the mother solar cell 150a.

Since the first solar cell 151 and the second solar cell 152 are formed by dividing the mother solar cell 150a, respectively, the planar shape has a substantially rectangular shape having a long axis and a short axis. In one example, the first solar cell 151 and the second solar cell 152 are disposed such that side surfaces 151c and 152c in the long axis direction face each other, and the first solar cell 151 and the second solar cell are disposed to form a first gap G.

Here, the side surfaces 151c and 152c of the first solar cell 151 and the second solar cell 152 facing each other are cut surfaces, respectively. Here, the cut surface refers to a surface cut along the cutting line CL when the mother solar cell 150a is divided to form the first solar cell 151 and the second solar cell 152. The mother solar cell 150a is formed with a division groove on its surface by laser processing in order to divide it into a plurality, and then divided into two by mechanical impact. Therefore, the cut surface formed along the cutting line CL has a larger surface roughness than the other side surfaces.

As the first solar cell 151 and the second solar cell 152 face each other so that the side surfaces 151c and 152c which are cut surfaces face each other, the protrusions 157 formed adjacent to the cut surfaces 151c and 152c are also disposed to face each other.

One side of the wiring member 142 is positioned on the back surface of the first solar cell 151 and connected to the second electrode 44 of the first solar cell 151, and the other side is positioned on the front surface of the second solar cell 152 and connected to the first electrode 42 of the second solar cell 152. Accordingly, the wiring member 142 is bent between the first solar cell 151 and the second solar cell 152. More precisely, the wiring member 142 is bent to face upward near the side surface 151c of the first solar cell 151, and is bent again by changing the direction at the side surface 152c of the second solar cell 152.

At this time, since the wiring member 142 is connected to the second solar cell 152 across the side surface 151c of the first solar cell 151, the wiring member 142 necessarily also crosses the protrusion 157 which is formed on the back surface adjacent to the side surface 151c of the first solar cell 151. Therefore, there is a high possibility of contact between the wiring member 142 and the protrusion 157, and in some cases, the wiring member 142 is in contact with the protrusion 157 to form a shunt path, so that there occurs a problem that the output of the solar cell module falls.

However, as the gap G between the first solar cell 151 and the second solar cell 152 becomes narrower, since the wiring member 142 needs to be bent more rapidly between the first solar cell 151 and the second solar cell 152, this becomes a problem.

Considering this problem as well, in one embodiment, the first and second solar cells 151 and 152 can be disposed such that the cut surfaces 151c and 152c do not face each other.

Figure 14:
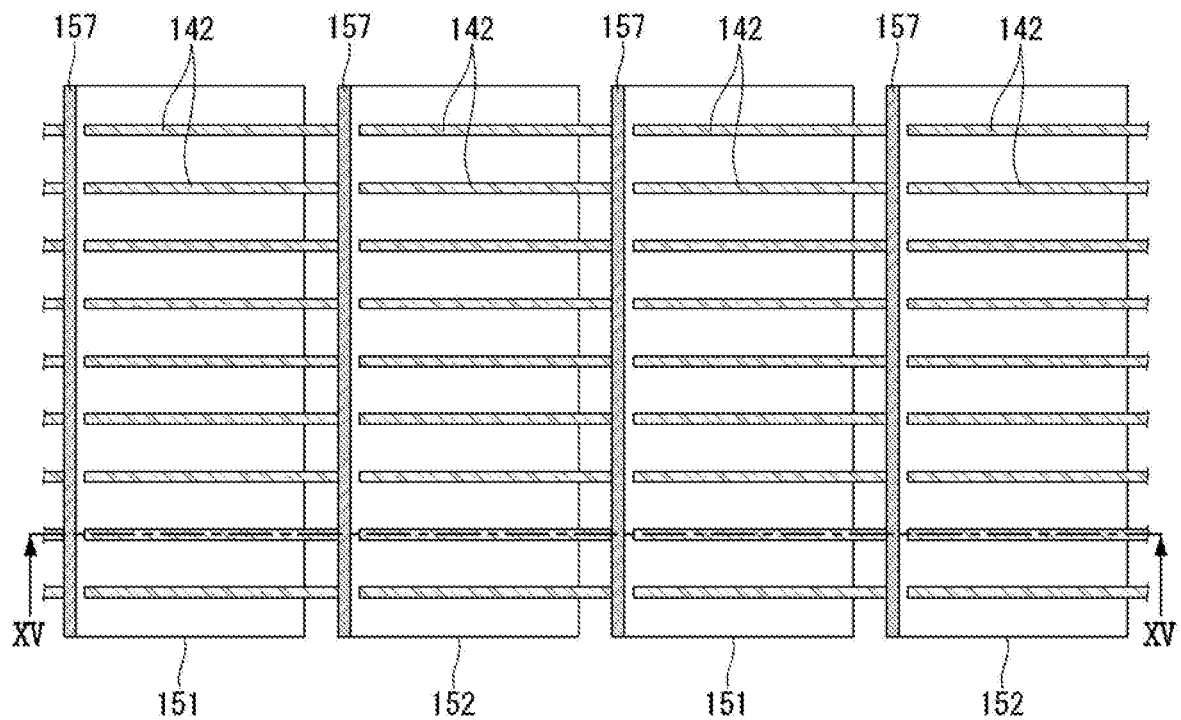
FIG. 14 is a plan view of a solar cell module disposed so that a cut surface and a non-cut surface face each other according to an embodiment of the present invention.
Figure 15:
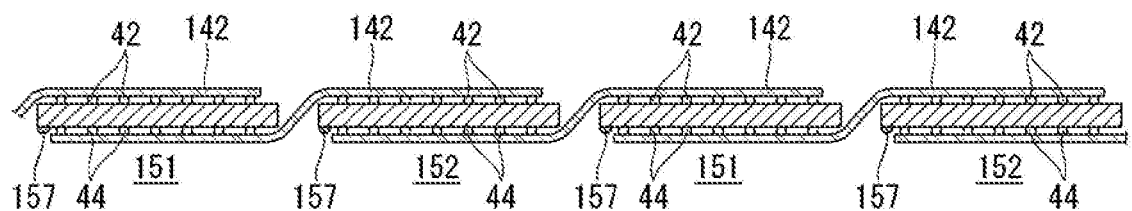
FIG. 15 is a cross-sectional view taken along a line XV-XV in FIG. 14.

FIG. 14 is a plan view of a solar cell module according to an embodiment of the present invention, and FIG. 15 is a cross-sectional view taken along a line XV-XV in FIG. 14. Here, FIG. 14 is a view illustrating the back surface of the first and second solar cells, and FIGS. 14 and 15 selectively simplify only the components necessary for convenience of description.

Referring to these drawings, in one embodiment, the solar cell module is repeatedly disposed in one direction by forming a pair of the first solar cell 151 and the second solar cell 152. According to this configuration, in one direction, the second solar cell 152 is disposed to be adjacent to the first solar cell 151, the first solar cell 151 is disposed again to be adjacent to the second solar cell 152, the second solar cell 152 is disposed to be adjacent to the first solar cell 151, and all of them can be disposed to be spaced apart at a first gap G.

The first solar cell 151 is disposed such that the other side surface 151d facing the cut surface 151c in one direction faces the one side surface 152c of the second solar cell 152, and the second solar cell 152 is disposed such that the cut surface 152c faces the one side surface 151c of the first solar cell 151. The other side surface 151d is a non-cut surface (or a non-cut initiation surface) and the surface roughness is smaller (or less protrusions are present) than the cut surface (or a cut initiation surface) 151c. Here, the non-cut surface refers to a surface where no mechanical or laser processing is performed or initiated in the process of dividing the mother solar cell, and accordingly, no protrusion is formed along the non-cut surface (or the non-cut initiation surface) unlike the cut surface (or the cut initiation surface).

By this arrangement, as a result, in the solar cell module, both the first solar cell 151 and the second solar cell 152 can be disposed only so that the cut surfaces 151c and 152c face one direction. In the drawing, both the cut surface 151c of the first solar cell 151 and the cut surface 152c of the second solar cell 152 are disposed on the left side.

And, one end of the wiring member 142 is positioned on the back of the first solar cell 151 and connected to the second electrode 44 disposed on the back surface of the first solar cell 151, and the other end of the wiring member is positioned on the front surface of the second solar cell 152 and connected to the first electrode 42 disposed on the front surface. The wiring member 142 is bent in an oblique direction between the first solar cell 151 and the second solar cell 152 to face the front surface from the back surface. At this time, the wiring member 142 is bent to cover the non-cut surface 151d of the first solar cell 151 and face the front surface of the second solar cell 152. However, since the protrusion 157 is not formed along the non-cut surface 151d, even if the wiring member 142 is bent rapidly between the first solar cell 151 and the second solar cell 152, being in contact with the protrusion 157 can be essentially prevented.

In addition, an end part 142a of the wiring member 142 can be disposed to be adjacent to but apart from the protrusion 157 so that the wiring member 142 can be prevented from being in contact with the protrusion 157 formed on the back of the first solar cell 151 in the back surface of the first solar cell 151.

Meanwhile, as described above, in the example, the second electrode 44 is composed to include a plurality of finger lines disposed in parallel with each other and a plurality of pad parts 422 electrically connected to the plurality of finger lines and positioned along one direction, and the end part 142a of the wiring member can be joined to the outermost pad 422a positioned to be closest to the protrusion 157 among the plurality of pad parts 422.

Accordingly, the efficiency of the solar cell module can be further improved by preventing the end part 142a of the wiring member from being in contact with the protrusion 157.

Meanwhile, in FIGS. 14 and 15, the cut surfaces 151c and 152c are disposed on the left side, and the non-cut surfaces 151d and 152d are disposed on the right side, and the wiring member 142 has been described to be composed to connect the second electrode 44 of the first solar cell 151 and the first electrode 42 of the second solar cell 152, however, the present invention is not limited thereto.

In another form, when the wiring member 142 is disposed to connect the first electrode 42 of the first solar cell 151 and the second electrode 44 of the second solar cell 152, the first and second solar cells 151 and 152 can be disposed in a form such that the cut surfaces 151c and 152c of the first solar cell 151 and the second solar cell 152 are disposed on the right side. Accordingly, as shown in FIGS. 14 and 15, the protrusions 157 are on a surface of the first and second solar cells 151 and 152 that does not have the wiring member 142 cross over the protrusion 157. Thus, protrusions 157 at edges of the first and second solar cells 151 and 152 are adjacent a truncated end of the wiring member 142.

The features, structures, effects and the like according to the above-described embodiments are included in at least one embodiment of the present invention, and are not necessarily limited to only the discussed embodiments. Furthermore, the features, structures, effects, and the like illustrated in the embodiments can be combined or modified in other embodiments by those skilled in the art to which the embodiments belong. Accordingly, contents related to these combinations and modifications should be construed as being included in the scope of the present invention.

What is claimed is:

1. A solar cell module, comprising:
  a first solar cell and a second solar cell adjacent to the first solar cell; and
  a wiring member,
  wherein each of the first solar cell and the second solar cell has a long axis and a short axis,
  each of the first solar cell and the second solar cell has a front surface, a back surface, a first side surface, a second side surface opposite to the first side surface along the short axis, a third side surface, and a fourth side surface opposite to the third side surface along the long axis,
  each of the first and second solar cells includes a front electrode disposed on the front surface, a back electrode disposed on the back surface, and a protrusion formed on the back surface and near the second side surface, and the protrusion extends perpendicular to the short axis and parallel to the long axis,
  the second side surface is a cut surface, and the first side surface of the first solar cell is disposed to face the second side surface of the second solar cell,
  the wiring member electrically connects the back electrode of the first solar cell and the front electrode of the second solar cell by extending between the first side surface of the first solar cell and the second side surface of the second solar cell, and the wiring member does not contact the protrusion of the first solar cell and the protrusion of the second solar cell,
  the protrusion is conductive,
  a gap between the first side surface of the first solar cell and the second side surface of the second solar cell ranges from 0.5 mm to 1.5 mm,
  a thickness of the wiring member is approximately 270 µm to 320 µm,
  the wiring member includes a core layer of metal, and a solder layer formed surrounding a surface of the core layer and including a solder material, and a thickness of the core layer is approximately 240 µm to 280 µm, and
  a number of the wiring member electrically connecting the back electrode of the first solar cell and the front electrode of the second solar cell is 8-12.

2. The solar cell module according to claim 1, wherein the wire member extends parallel to the short axis, and crosses over the protrusion of the second solar cell.

3. The solar cell module according to claim 1, wherein the wiring member terminates before the protrusion formed on the back surface of the first solar cell.

4. The solar cell module according to claim 1, wherein the second side surface has a larger surface roughness than the first side surface.

5. The solar cell module according to claim 1, wherein the wiring member is bent in an oblique direction between the first solar cell and the second solar cell.

6. The solar cell module according to claim 1, wherein each of the first solar cell and the second solar cell does not include a protrusion formed on the front surface.

7. The solar cell module according to claim 1, wherein a length of the protrusion of the first solar cell is approximately equal to a length of the first solar cell along the long axis.

8. The solar cell module according to claim 1, wherein a gap between the first side surface of the first solar cell and the second side surface of the second solar cell is determined based on a thickness of the wiring member and a material for forming the core layer.

9. The solar cell module according to claim 1, wherein the protrusion includes raised portions having one or more peaks above a planar surface of the back surface.

10. The solar cell module according to claim 1, wherein the short axis is approximately half a length of the long axis.

11. The solar cell module according to claim 1, wherein in each of the first and second solar cells, the front electrode comprises: finger lines extending in parallel with the long axis, bus bars extending in parallel with the short axis and connected to the finger lines, and pad parts arranged along the short axis and connecting the bus bars to the wiring member,
  wherein the finger lines comprise a first outermost finger line closest to the first side surface and a second outermost finger line closest to the second side surface, and the pad parts comprises a first pad part closest to the first side surface and a second pad part closest to the second side surface, and
  wherein the first pad part is positioned at a crossing of the first outermost finger line and the wiring member, and the second pad part is positioned at a crossing of the second outermost finger line and the wiring member.

12. The solar cell module according to claim 1, wherein in each of the first and second solar cells, the front electrode comprises: finger lines extending in parallel with the long axis, bus bars extending in parallel with the short axis and connected to the finger lines, and pad parts arranged along the short axis and connecting the bus bars to the wiring member,
  wherein the finger lines comprise a first outermost finger line closest to the first side surface and a second outermost finger line closest to the second side surface, and the pad parts comprises a first pad part closest to the first side surface and a second pad part closest to the second side surface, and
  wherein each of the first outermost finger line and the second outermost finger line is straight and continuous.

13. The solar cell module according to claim 1, wherein, in each of the first and second solar cells, the front electrode comprises: finger lines extending in parallel with the long axis, bus bars extending in parallel with the short axis and connected to the finger lines, and pad parts arranged along the short axis and connecting the bus bars to the wiring member,
  wherein the bus bars comprise a first outermost bus bar closest to the third side surface, a second outermost bus bar closest to the fourth side surface, and middle bus bars, and
  wherein a distance between the first outermost bus bar and the third side surface, a distance between the first outermost bus bar and one of the middle bus bars adjacent to the first outermost bus bar, a distance between the second outermost bus bar and the fourth side surface, a distance between the second outermost bus bar and one of the middle bus bars adjacent to the second outermost bus bar, and a distance between adjacent middle bus bars are equal.

14. The solar cell module according to claim 1, wherein each of the first solar cell and the second solar cell includes:
  a semiconductor substrate;
  a first conductive type region formed on a front surface of the semiconductor substrate; and
  a second conductive type region formed on a back surface of the semiconductor substrate, wherein the first conductive type region has a first conductive type, and the semiconductor substrate and the second conductive type region have a second conductive type opposite to the first conductive type.

15. The solar cell module according to claim 14, wherein the protrusion is formed on the second conductive type region.

16. The solar cell module according to claim 1, wherein the front electrode includes a plurality of front finger lines parallel to each other and a front bus bar electrically connected to the plurality of front finger lines, and the front bus bar includes a plurality of front pad parts positioned along the short axis, the back electrode includes a plurality of back finger lines parallel to each other and a back bus bar electrically connected to the plurality of back finger lines, and the back bus bar includes a plurality of back pad parts positioned along the short axis, and the wiring member is joined to the plurality of back pad parts of the first solar cell and the plurality of front pad parts of the second solar cell.

17. The solar cell module according to claim 16, wherein the wiring member includes a first end and a second end, the first end is joined to an outermost one among the plurality of back pad parts of the first solar cell that is disposed to be closest to the protrusion of the first solar cell, and the second end is joined to an outermost one among the plurality of front pad parts of the second solar cell that is disposed to be closest to the first side surface of the second solar cell.

* * * * *